(12) United States Patent
Drzaic et al.

(10) Patent No.: US 6,842,657 B1
(45) Date of Patent: Jan. 11, 2005

(54) REACTIVE FORMATION OF DIELECTRIC LAYERS AND PROTECTION OF ORGANIC LAYERS IN ORGANIC SEMICONDUCTOR DEVICE FABRICATION

(75) Inventors: Paul S. Drzaic, Lexington, MA (US); Jianna Wang, Waltham, MA (US)

(73) Assignee: E Ink Corporation, Cambridge, MA (US)

( * ) Notice: Subject to any disclaimer, the term of this patent is extended or adjusted under 35 U.S.C. 154(b) by 878 days.

(21) Appl. No.: 09/621,000

(22) Filed: Jul. 21, 2000

Related U.S. Application Data

(63) Continuation-in-part of application No. 09/289,036, filed on Apr. 9, 1999, now Pat. No. 6,518,949.
(60) Provisional application No. 60/144,943, filed on Jul. 21, 1999, and provisional application No. 60/147,989, filed on Aug. 10, 1999.

(51) Int. Cl.[7] .............................................. G06F 19/00
(52) U.S. Cl. ........................................ 700/120; 438/99
(58) Field of Search ..................... 700/119–121, 123, 700/124, 125, 117, 118; 438/99, 499; 257/17, 40, 24; 345/87, 92, 107; 430/20

(56) References Cited

U.S. PATENT DOCUMENTS

| | | |
|---|---|---|
| 2,800,457 A | 7/1957 | Green et al. .............. 428/402.2 |
| 3,036,388 A | 5/1962 | Tate ............................ 434/409 |
| 3,384,488 A | 5/1968 | Tulagin et al. ................ 430/32 |
| 3,406,363 A | 10/1968 | Tate ........................... 335/302 |
| 3,460,248 A | 8/1969 | Tate ............................. 29/607 |
| 3,585,381 A | 6/1971 | Hodson et al. ............... 349/21 |
| 3,612,758 A | 10/1971 | Evans et al. ................. 348/803 |
| 3,668,106 A | 6/1972 | Ota ............................ 358/305 |
| 3,670,323 A | 6/1972 | Sobel et al. ................ 345/107 |
| 3,756,693 A | 9/1973 | Ota ............................ 345/107 |
| 3,767,392 A | 10/1973 | Ota ............................. 430/35 |
| 3,772,013 A | 11/1973 | Wells .......................... 430/34 |
| 3,792,308 A | 2/1974 | Ota ............................ 315/150 |
| 3,806,893 A | 4/1974 | Ohnishi et al. ............. 365/153 |
| 3,850,627 A | 11/1974 | Wells et al. .................. 430/34 |
| 3,892,568 A | 7/1975 | Ota ............................. 430/19 |
| 4,001,140 A | 1/1977 | Foris et al. ............ 427/213.34 |
| 4,041,481 A | 8/1977 | Sato ........................... 345/107 |
| 4,045,327 A | 8/1977 | Noma et al. ................ 359/237 |
| 4,062,009 A | 12/1977 | Raverdy et al. .............. 345/48 |
| 4,068,927 A | 1/1978 | White ......................... 359/296 |
| 4,071,430 A | 1/1978 | Liebert ....................... 359/241 |
| 4,088,395 A | 5/1978 | Gigila ........................ 359/269 |
| 4,093,534 A | 6/1978 | Carter et al. ................ 359/296 |
| 4,123,346 A | 10/1978 | Ploix .......................... 359/271 |
| 4,126,528 A | 11/1978 | Chiang ....................... 359/296 |
| 4,126,854 A | 11/1978 | Sheridon .................... 345/107 |

(List continued on next page.)

FOREIGN PATENT DOCUMENTS

| | | |
|---|---|---|
| EP | 0 186 710 A1 | 7/1986 |
| EP | 0 204 063 | 10/1987 |
| EP | 0 240 063 B1 | 10/1987 |

(List continued on next page.)

OTHER PUBLICATIONS

Klauk et al., "All–Organic Integrated Emissive Pixels", Jun. 1999, Annual Device Research Conference Digest, 57, pp. 162–163.*

(List continued on next page.)

*Primary Examiner*—Leo Picard
*Assistant Examiner*—Chad Rapp
(74) *Attorney, Agent, or Firm*—Testa, Hurwitz & Thibeault, LLP

(57) ABSTRACT

In one embodiment of the invention, a method of manufacturing a semiconductor device comprises the steps of: a) providing an organic semiconductor layer; b) depositing a reactive species on a portion of the organic semiconductor layer; and c) reacting the reactive species with the portion of the organic layer to form a dielectric layer.

7 Claims, 6 Drawing Sheets

U.S. PATENT DOCUMENTS

| | | | |
|---|---|---|---|
| 4,143,103 A | 3/1979 | Sheridon | 264/4 |
| 4,143,472 A | 3/1979 | Murata et al. | 434/409 |
| 4,147,932 A | 4/1979 | Lewis | 250/330 |
| 4,149,149 A | 4/1979 | Miki et al. | 345/38 |
| 4,166,800 A | 9/1979 | Foag | 427/212 |
| 4,203,106 A | 5/1980 | Dalisa et al. | 345/107 |
| 4,211,668 A | 7/1980 | Tate | 428/402.2 |
| 4,218,302 A | 8/1980 | Dalisa et al. | 359/296 |
| 4,231,641 A | 11/1980 | Randin | 359/274 |
| 4,261,653 A | 4/1981 | Goodrich | 359/296 |
| 4,272,596 A | 6/1981 | Harbour et al. | 430/37 |
| 4,273,672 A | 6/1981 | Vassiliades | 264/4.1 |
| 4,298,448 A | 11/1981 | Müller et al. | 359/296 |
| 4,305,807 A | 12/1981 | Somlyody | 349/166 |
| 4,311,361 A | 1/1982 | Somlyody | 359/296 |
| 4,314,013 A | 2/1982 | Chang | 430/37 |
| 4,324,456 A | 4/1982 | Dalisa | 359/296 |
| 4,368,952 A | 1/1983 | Murata et al. | 359/296 |
| 4,390,403 A | 6/1983 | Batchelder | 204/547 |
| 4,418,346 A | 11/1983 | Batchelder | 345/107 |
| 4,419,383 A | 12/1983 | Lee | 427/550 |
| 4,438,160 A | 3/1984 | Ishikawa et al. | 427/214 |
| 4,450,440 A | 5/1984 | White | 345/35 |
| 4,502,934 A | 3/1985 | Gazard et al. | 204/242 |
| 4,522,472 A | 6/1985 | Liebert et al. | 359/296 |
| 4,543,306 A | 9/1985 | Dubois et al. | 429/337 |
| 4,620,916 A | 11/1986 | Zwemer et al. | 359/296 |
| 4,643,528 A | 2/1987 | Bell, Jr. | 349/166 |
| 4,648,956 A | 3/1987 | Marshall et al. | 359/296 |
| 4,655,897 A | 4/1987 | DiSanto et al. | 359/296 |
| 4,707,080 A | 11/1987 | Fergason | 349/89 |
| 4,732,830 A | 3/1988 | DiSanto et al. | 430/20 |
| 4,742,345 A | 5/1988 | DiSanto et al. | 345/107 |
| 4,746,917 A | 5/1988 | DiSanto et al. | 345/107 |
| 4,748,366 A | 5/1988 | Taylor | 310/328 |
| 4,833,464 A | 5/1989 | DiSanto et al. | 345/107 |
| 4,846,931 A | 7/1989 | Gmitter et al. | 438/2 |
| 4,883,561 A | 11/1989 | Gmitter et al. | 438/27 |
| 4,889,603 A | 12/1989 | DiSanto et al. | 45/30 |
| 4,909,959 A | 3/1990 | Lemaire et al. | 252/500 |
| 4,919,521 A | 4/1990 | Tada et al. | 359/296 |
| 4,931,019 A | 6/1990 | Park | 434/409 |
| 4,947,219 A | 8/1990 | Boehm | 257/471 |
| 5,017,225 A | 5/1991 | Nakanishi et al. | 106/31.21 |
| 5,041,824 A | 8/1991 | DiSanto et al. | 345/107 |
| 5,053,763 A | 10/1991 | DiSanto et al. | 345/107 |
| 5,057,363 A | 10/1991 | Nakanishi | 428/321.5 |
| 5,059,694 A | 10/1991 | Delabouglise et al. | 548/518 |
| 5,066,105 A | 11/1991 | Yoshimoto et al. | 349/53 |
| 5,066,559 A | 11/1991 | Elmasry et al. | 430/115 |
| 5,066,946 A | 11/1991 | Disanto et al. | 345/107 |
| 5,070,326 A | 12/1991 | Yoshimoto et al. | 349/53 |
| 5,077,157 A | 12/1991 | DiSanto et al. | 430/20 |
| 5,082,351 A | 1/1992 | Fergason | 349/86 |
| 5,105,185 A | 4/1992 | Nakanowatari et al. | 345/94 |
| 5,128,785 A | 7/1992 | Yoshimoto et al. | 349/53 |
| 5,132,049 A | 7/1992 | Garreau et al. | 252/500 |
| 5,138,472 A | 8/1992 | Jones et al. | 349/166 |
| 5,149,826 A | 9/1992 | Delabouglise et al. | 548/518 |
| 5,151,032 A | 9/1992 | Igawa | 434/409 |
| 5,174,882 A | 12/1992 | DiSanto et al. | 359/238 |
| 5,177,476 A | 1/1993 | DiSanto et al. | 345/107 |
| 5,185,226 A | 2/1993 | Grosso et al. | 430/47 |
| 5,187,609 A | 2/1993 | DiSanto et al. | 359/296 |
| 5,204,424 A | 4/1993 | Roncali et al. | 526/256 |
| 5,216,416 A | 6/1993 | DiSanto et al. | 345/107 |
| 5,223,115 A | 6/1993 | DiSanto et al. | 359/238 |
| 5,223,823 A | 6/1993 | Disanto et al. | 345/107 |
| 5,247,290 A | 9/1993 | Di Santo et al. | 345/107 |
| 5,250,388 A | 10/1993 | Schoch, Jr. et al. | 430/269 |
| 5,250,932 A | 10/1993 | Yoshimoto et al. | 349/53 |
| 5,250,938 A | 10/1993 | DiSanto et al. | 345/107 |
| 5,254,981 A | 10/1993 | Disanto et al. | 345/107 |
| 5,262,098 A | 11/1993 | Crowley et al. | 264/8 |
| 5,266,937 A | 11/1993 | DiSanto et al. | 345/107 |
| 5,268,448 A | 12/1993 | Buechner et al. | 528/380 |
| 5,270,843 A | 12/1993 | Wang | 349/90 |
| 5,276,438 A | 1/1994 | DiSanto et al. | 345/107 |
| 5,279,511 A | 1/1994 | DiSanto et al. | 445/24 |
| 5,279,694 A | 1/1994 | DiSanto et al. | 136/275.5 |
| 5,293,528 A | 3/1994 | DiSanto et al. | 345/107 |
| 5,296,974 A | 3/1994 | Tada et al. | 359/885 |
| 5,298,833 A | 3/1994 | Hou | 313/483 |
| 5,302,235 A | 4/1994 | DiSanto et al. | 216/5 |
| 5,303,073 A | 4/1994 | Shirota et al. | 349/74 |
| 5,304,439 A | 4/1994 | Disanto et al. | 430/20 |
| 5,315,312 A | 5/1994 | DiSanto et al. | 345/107 |
| 5,316,341 A | 5/1994 | Schwartz | 281/15.1 |
| 5,344,594 A | 9/1994 | Sheridon | 264/4.1 |
| 5,347,144 A | 9/1994 | Garnier et al. | 257/40 |
| 5,359,346 A | 10/1994 | DiSanto et al. | 345/107 |
| 5,360,689 A | 11/1994 | Hou et al. | 430/34 |
| 5,362,671 A | 11/1994 | Zavracky et al. | 438/29 |
| 5,380,362 A | 1/1995 | Schubert | 106/493 |
| 5,383,008 A | 1/1995 | Sheridon | 349/156 |
| 5,389,945 A | 2/1995 | Sheridon | 345/85 |
| 5,402,145 A | 3/1995 | Disanto et al. | 345/107 |
| 5,403,515 A | 4/1995 | Instone et al. | 510/427 |
| 5,411,398 A | 5/1995 | Nakanishi et al. | 434/409 |
| 5,411,656 A | 5/1995 | Schubert | 345/107 |
| 5,421,926 A | 6/1995 | Yukinobu et al. | 156/83 |
| 5,460,688 A | 10/1995 | DiSanto et al. | 216/5 |
| 5,463,492 A | 10/1995 | Check, III | 359/296 |
| 5,467,107 A | 11/1995 | DiSanto et al. | 345/107 |
| 5,498,674 A | 3/1996 | Hou et al. | 523/369 |
| 5,508,068 A | 4/1996 | Nakano | 427/553 |
| 5,512,162 A | 4/1996 | Sachs et al. | 205/91 |
| 5,543,219 A | 8/1996 | Elwakil | 428/402.24 |
| 5,552,679 A | 9/1996 | Murasko | 315/169.3 |
| 5,556,583 A | 9/1996 | Tashiro et al. | 264/4.1 |
| 5,561,443 A | 10/1996 | Disanto et al. | 345/107 |
| 5,565,885 A | 10/1996 | Tamanoi | 345/100 |
| 5,573,711 A | 11/1996 | Hou et al. | 252/572 |
| 5,574,291 A | 11/1996 | Dodabalapur et al. | 257/40 |
| 5,582,700 A | 12/1996 | Bryning et al. | 204/450 |
| 5,583,675 A | 12/1996 | Yamada et al. | 349/84 |
| 5,596,208 A | 1/1997 | Dodabalapur et al. | 257/66 |
| 5,597,889 A | 1/1997 | Takimoto et al. | 427/58 |
| 5,604,027 A | 2/1997 | Sheridon | 428/323 |
| 5,604,070 A | 2/1997 | Rao et al. | 430/108.22 |
| 5,610,455 A | 3/1997 | Allen et al. | 307/400 |
| 5,614,340 A | 3/1997 | Bugner et al. | 430/41 |
| 5,625,199 A * | 4/1997 | Baumbach et al. | 257/40 |
| 5,627,561 A | 5/1997 | Laspina et al. | 345/107 |
| 5,635,317 A | 6/1997 | Taniguchi et al. | 430/7 |
| 5,638,103 A | 6/1997 | Obata et al. | 347/164 |
| 5,639,914 A | 6/1997 | Tomiyama et al. | 564/309 |
| 5,643,673 A | 7/1997 | Hou | 428/402.24 |
| 5,650,872 A | 7/1997 | Saxe et al. | 359/296 |
| 5,654,367 A | 8/1997 | Takimoto et al. | 525/18 |
| 5,659,181 A | 8/1997 | Bridenbaugh et al. | 257/40 |
| 5,663,224 A | 9/1997 | Emmons et al. | 524/188 |
| 5,672,381 A | 9/1997 | Rajan | 427/198 |
| 5,673,148 A | 9/1997 | Morris et al. | 359/536 |
| 5,676,884 A | 10/1997 | Tiers et al. | 252/582 |
| 5,691,098 A | 11/1997 | Busman et al. | 430/158 |
| 5,693,442 A | 12/1997 | Weiss et al. | 430/66 |
| 5,693,977 A | 12/1997 | Haddon et al. | 257/431 |
| 5,694,224 A | 12/1997 | Tai | 358/3.01 |
| 5,705,826 A | 1/1998 | Aratani et al. | 257/40 |
| 5,707,738 A | 1/1998 | Hou | 428/402 |

| | | | | | |
|---|---|---|---|---|---|
| 5,707,747 A | 1/1998 | Tomiyama et al. ......... 428/457 | JP | 62231930 | 10/1987 |
| 5,708,525 A | 1/1998 | Sheridon ................... 359/296 | JP | 62269124 | 11/1987 |
| 5,709,976 A | 1/1998 | Malhotra ................ 428/32.11 | JP | 62299824 | 12/1987 |
| 5,714,270 A | 2/1998 | Malhotra et al. ....... 428/32.11 | JP | 0186116 | 3/1989 |
| 5,715,511 A | 2/1998 | Aslam et al. ............... 399/320 | JP | 01086116 | 3/1989 |
| 5,716,550 A | 2/1998 | Gardner et al. ............ 252/500 | JP | 01086117 A | 3/1989 |
| 5,717,283 A | 2/1998 | Biegelsen et al. .......... 313/483 | JP | 01086118 | 3/1989 |
| 5,717,514 A | 2/1998 | Sheridon ................... 359/296 | JP | 64-86116 | 3/1989 |
| 5,717,515 A | 2/1998 | Sheridon ................... 359/296 | JP | 01142537 A | 6/1989 |
| 5,725,935 A | 3/1998 | Rajan ...................... 428/195.1 | JP | 01177517 | 7/1989 |
| 5,729,632 A | 3/1998 | Tai ............................. 382/237 | JP | 01248182 A | 10/1989 |
| 5,737,115 A | 4/1998 | Mackinlay et al. ......... 359/296 | JP | 01267525 | 10/1989 |
| 5,739,801 A | 4/1998 | Sheridon ..................... 345/84 | JP | 02223934 A | 9/1990 |
| 5,745,094 A | 4/1998 | Gordon, II et al. ......... 345/107 | JP | 02223935 A | 9/1990 |
| 5,751,268 A | 5/1998 | Sheridon .................... 345/107 | JP | 02223936 A | 9/1990 |
| 5,753,763 A | 5/1998 | Rao et al. ................... 525/276 | JP | 02284124 A | 11/1990 |
| 5,754,332 A | 5/1998 | Crowley ..................... 359/296 | JP | 02284125 A | 11/1990 |
| 5,759,671 A | 6/1998 | Tanaka et al. .............. 428/166 | JP | 5-61421 | 3/1993 |
| 5,760,761 A | 6/1998 | Sheridon .................... 345/107 | JP | 05165064 A | 6/1993 |
| 5,767,826 A | 6/1998 | Sheridon et al. .............. 345/84 | JP | 05173194 A | 7/1993 |
| 5,777,782 A | 7/1998 | Sheridon ................... 359/296 | JP | 05307197 A | 11/1993 |
| 5,783,614 A | 7/1998 | Chen et al. ................. 523/205 | JP | 6089081 | 3/1994 |
| 5,808,783 A | 9/1998 | Crowley ..................... 359/296 | JP | 6-202168 | 7/1994 |
| 5,825,529 A | 10/1998 | Crowley ..................... 359/296 | JP | 9-6277 | 1/1997 |
| 5,828,432 A | 10/1998 | Shashidhar et al. ......... 349/139 | JP | 950181574 | 2/1997 |
| 5,843,259 A | 12/1998 | Narang et al. .............. 156/151 | JP | 9-185087 | 7/1997 |
| 5,900,858 A | 5/1999 | Richley ...................... 345/107 | JP | 09230391 | 9/1997 |
| 5,914,806 A | 6/1999 | Gordon, II et al. ......... 359/296 | JP | 10-48673 | 2/1998 |
| 5,930,026 A | 7/1999 | Jacobson et al. ........... 359/296 | JP | 10072571 A | 3/1998 |
| 5,936,259 A | 8/1999 | Katz et al. ..................... 257/40 | JP | 10135481 | 5/1998 |
| 5,946,551 A * | 8/1999 | Dimitrakopoulos et al. .. 438/99 | JP | 10142628 | 5/1998 |
| 5,969,376 A | 10/1999 | Bao .............................. 257/40 | JP | 10-149118 | 6/1998 |
| 5,998,804 A * | 12/1999 | Suh et al. ..................... 257/40 | JP | 10-161116 | 6/1998 |
| 6,033,998 A * | 3/2000 | Aronowitz et al. .......... 438/786 | JP | 1019001 | 7/1998 |
| 6,197,663 B1 * | 3/2001 | Chandross et al. .......... 438/455 | JP | 11195790 A | 7/1999 |
| | | | WO | WO 82/02961 | 9/1982 |

FOREIGN PATENT DOCUMENTS

| | | | | | |
|---|---|---|---|---|---|
| EP | 0 268 877 | 6/1988 | WO | WO 90/08402 | 7/1990 |
| EP | 0 281 204 A2 | 9/1988 | WO | WO 92/12453 | 7/1992 |
| EP | 0 323 656 | 7/1989 | WO | WO 92/17873 | 10/1992 |
| EP | 0 325 013 B1 | 7/1989 | WO | WO 92/20060 | 11/1992 |
| EP | 0 325 013 A1 | 7/1989 | WO | WO 93/18428 | 9/1993 |
| EP | 0 361 420 A2 | 4/1990 | WO | WO 94/24236 | 10/1994 |
| EP | 0 362 928 | 4/1990 | WO | WO 95/02636 | 1/1995 |
| EP | 0 375 005 | 6/1990 | WO | WO 95/05622 | 2/1995 |
| EP | 0 396 937 | 11/1990 | WO | WO 95/15363 | 6/1995 |
| EP | 0 404 545 | 12/1990 | WO | WO 95/19227 | 7/1995 |
| EP | 0 408 105 | 1/1991 | WO | WO 95/27924 | 10/1995 |
| EP | 0 442 123 A1 | 8/1991 | WO | WO 95/33085 | 12/1995 |
| EP | 0 442 123 | 8/1991 | WO | WO 96/17102 | 6/1996 |
| EP | 0 443 571 A2 | 8/1991 | WO | WO 96/41372 | 12/1996 |
| EP | 0 460 747 A2 | 12/1991 | WO | WO 97/04398 | 2/1997 |
| EP | 0 525 852 | 2/1993 | WO | WO 97/35298 | 9/1997 |
| EP | 0 537 240 | 4/1993 | WO | WO 97/49125 | 12/1997 |
| EP | 0 540 281 A2 | 5/1993 | WO | WO 98/03896 | 1/1998 |
| EP | 0 417 362 | 5/1995 | WO | WO 98/12585 | 3/1998 |
| EP | 0 721 176 | 7/1996 | WO | WO 98/19208 | 5/1998 |
| EP | 0 825 657 | 2/1998 | WO | WO 98/41898 | 9/1998 |
| EP | 0 852 403 | 7/1998 | WO | WO 98/41899 | 9/1998 |
| EP | 0 863 557 A2 | 9/1998 | WO | WO 98/55897 | 12/1998 |
| EP | 0 930 641 A2 | 7/1999 | WO | WO 98/58383 | 12/1998 |
| FR | 2 693 005 | 12/1993 | WO | WO 99/10939 | 3/1999 |
| GB | 1 314 906 | 4/1973 | WO | WO 99/12170 | 3/1999 |
| GB | 1 465 701 | 3/1977 | WO | WO 99/14762 | 3/1999 |
| GB | 2 044 508 | 10/1980 | WO | WO 99/14763 | 3/1999 |
| GB | 2 306 229 | 4/1997 | WO | WO 99/26419 | 5/1999 |
| GB | 2 330 451 A | 4/1999 | WO | WO 99/04631 | 8/1999 |
| JP | 53-73098 | 6/1978 | WO | WO 99/40631 | 8/1999 |
| JP | 55096922 | 7/1980 | WO | WO 99/45416 | 9/1999 |
| JP | 60189731 | 9/1985 | WO | WO 99/45582 | 9/1999 |
| JP | 62058222 | 3/1987 | WO | WO 99/63527 | 12/1999 |
| | | | WO | WO 99/65011 | 12/1999 |
| | | | WO | WO 99/65012 | 12/1999 |

OTHER PUBLICATIONS

Bao et al., "Soluble and processable regioregular poly(3–hexylthiophene) for thin film field–effect transistor applications with high mobility," *American Institute of Physics*, vol. 69, No. 26, Dec. 23, 1996, pp. 4108–4110.

Bao et al., "High–Performance Plastic Transistors Fabricated by Printing Techniques," *Chemical Matter*, vol. 9, 1997, pp. 1299–1301.

Dodabalapur et al., "Organic Smart Pixels," *American Institute of Physics*, 1998, pp. 142–144.

Torsi et al., "Organic Thin–Film–Transistors With High On/Off Ratios," *Materials Research Society Symposium Proceeding*, vol. 377, 195, pp. 895–700.

Horowitz, "Organic Field–Effect Transistors," *Advanced Materials*, vol. 10, No. 5, 1998, pp. 365–377.

McCullough, "The Chemistry of Conducting Polythiophenens," *Advanced Materials*, vol. 10, No. 2, 1998, pp. 93–116.

Kenward, "Displaying a Winning Glow," *Technology Review*, Jan./Feb. 1999, pp. 69–73.

Clarisse et al., "Field Effect Transistor with Diphthalocyanine Thin Film," *Electronics Letters*, vol. 24, No. 11, May 1988, pp. 674–675.

Comiskey et al., "Late–News Paper Electrophoretic Ink: A Printable Display Material," *SID 97 Digest*, May 13, 1997, pp. 75.

Dobson, "Electronic Book is a Whole Library," *The Sunday Times*, Feb. 25, 1996.

Zollinger, "Structures of Simple Di–and Triarylmethine Dyes," *Color Chemistry: Syntheses, Properties and Applications of Organic Dyes and Pigments*, $2^{nd}$ Revised Edition, 1991, p. 73.

M.H. Gutcho, "Pigments and Paints," *Microcapsules and Microencapsulation Techniques*, 1976, pp. 178–193.

Bohnke et al., "Polymer–Based Solid Electrochromic Cell for Matrix–Addressable Display Devices," *J. Electrochem. Soc.*, vol. 138, No. 121, Dec. 1991, pp. 3612–3617.

Murau, "Characteristics of an X–Y Addressed Electrophoretic Image Display (EPID)," *SID 84 Digest*, 1984, pp. 141.

Garnier et al., "All–Polymer Field–Effect Transistor Realized by Printing Techniques," Sep. 16, 1994, vol. 265, pp. 1684–1686.

Lu et al., "Studies of Polymer–Based Field Effect Transistors," Sep. 1993, vol. 2, pp. 814–816.

Masui et al., "Effect of Crystallinity on Electrical Conductivity of Alpha CU–Phthalocyanin Film," May 1, 1992, vol. 112A, No. 5, pp. 371–374.

Nakamura et al., "Development of Electrophoretic Display Using Microencapsulated Suspension," *1998 ISD International Symposium Disgust of Technical Papers. vol. 29, Proceedings of SID '98 International Symposium, Anaheim, CA, USA*, May 1998, pp. 1014–1017.

Sankus, "Electrophoretic Display Cell," *Xerox Disclosure Journal*, vol. 4, No. 3, May/Jun. 1979, pp. 309.

"Microencapsulation with Synthetic Polymeric Film Formers," *Microcapsules and Microencapsulation Techniques*, 1976, pp. 65–130.

Ballinger et al., "Magnetic Recording Paper is Erasable," *Electronics*, Mar. 1, 1973, pp. 73–76.

Beilin et al, "2000–Character Electrophoretic Display," *SID 86 Digest*, 1986, pp. 136–140.

Chiang, "Conduction Mechanism of Charge Control Agents Used in Electrophoretic Display Devices," *Proceeding of the SID 18*, vol. 18, Nos. 3 & 4, 1977, pp. 275–282.

Clarisse, "A High Speed Electrophoretic Matrix Display," *SID 80 Digest*, 1980, pp. 114–115.

Dalisa, "Electrophoretic Display Technology," *Transactions on Electron Devices*, vol. 24, No. 7, Jul. 1977, pp. 827–834.

Egashira et al., "A Solid Electrochromic Cell Consisting of Lu–Diphthaocyanine and Lead Fluoride," *Proceeding of the SID*, vol. 28, No. 3, 1987, pp. 227–232.

Fitzhenry, "Optical Effects of Adsorption of dyes on Pigment Used in Electrophoretic Image Displays," *Applied Optics*, vol. 18, No. 19, Oct. 1979, pp. 3332–3337.

Fitzhenry–Ritz, "Optical Properties of Electrophorectic Image Displays," *Proceeding of the SID*, vol. 22, No. 4, 1981, pp. 300–309.

Goodman, "Passive Liquid Displays: Liquid Crystals, Electrophoretics, and Electrochromics," *Proceeding of the SID*, vol. 17, No. 1, 1976, pp. 30–38.

Gutcho, "Additional Uses for Encapsulated Products," *Microcapsules and Microencapsulation Techniques*, 1976, pp. 279–343.

Hatano et al., (1996), "Bistable Paper–White Display Device Using Cholesteric Liquid Crystals", *SID 96 Digest*, 1996, pp. 269–272.

Jin et al., "Optically Transparent, Electrically Conductive Composite Medium," *Science*, vol. 255, Jan. 24, 1992, pp. 446–448.

Lewis et al., "Gravitational, Inter–Particle and ParticleElectrode Forces in the Electrophoretic Display," *Proceeding of the SID*, vol. 18, Nos. 3 & 4, 1977, pp. 235–242.

Mürau et al., "The Understanding and Elimination of Some Suspension Instabilities in an Electrophoretic Display," *Journal of Applied Physics*, vol. 49, No. 9, 1978, pp. 4820–4829.

Vaz et al., "Dual Frequency Addressing of Polymer–Dispensed Liquid–Crystal Films," *Journal of Applied Physics*, vol. 65, No. 12, Jun. 15, 1989, pp. 5043–5049.

Ota et al., "Developments in Elecrophoretic Displays," *Proceedings of the SID*, vol. 18, Nos. 3 & 4, 1977, pp. 243–254.

Ota et al., "Electrophoretic Image Display (EPID) Panel," *Proceedings of the IEEE*, 1973, pp. 1–5.

Ota et al., "Electrophoretic Display Devices," *Laser 75 Optoelectronics Conference Proceedings*, pp. 145–148.

Pearlstein, "Electroless Plating," *Modern Electroplating*, pp. 710–747.

Sheridon et al., "The Gyricon–A Twisting Ball Display," *Proceeding of the SID*, 1977, vol. 18, Nos. 3 and 4, pp. 289–293.

Shiwa. S. et al., "Electrophoretic Display Method Using Ionographic Technology," *SID 88 Digest*, 1988, pp. 61–62.

Singer et al., "An X–Y Addressable Electrophoretic Display," *Proceeding of the SID*, vol. 18, Nos. 3 & 4, 1977, pp. 255–266.

Yang et al., "A New Architecture for Polymer Transistors," *Nature*, vol. 372, Nov. 24, 1994, pp. 344–346.

Flaherty, "What Did Disappearing Ink Grow Up to Be? Electronic Ink," *The New York Times*, May 6, 1999.

Negroponte et al., "Surfaces and Displays," *Wired*, Jan. 1997, pp. 212.

Comiskey et al, "An Electrophoretic Ink for All–Printed Reflective Electronic Displays," *Nature*, vol. 394, Jul. 16, 1998, pp. 253–255.

Zurer, "Digital Ink Brings Electronic Books Closer," *Chemical*, Jul. 20, 1998, pp. 12–13.

Peterson, "Rethinking Ink. Printing the Pages of an Electronic Book," *Science News*, vol. 153, Jun. 20, 1998, pp. 396–397.

Guernsey, "Beyond Neon: Electronic Ink," *New York Times*, Jun. 3, 1999, pp. 11.

White, "An Electrophoretic Bar Graph Display," *Proceedings of the SID*, vol. 22, No. 3, 1981, pp. 173–180.

Pansu et al., "Structures of Thin Layers of Hard Spheres: High Pressure Limit," *J. Physique*, vol. 45, Feb. 1984, pp. 331–339.

Peiranski et al., Thin Colloidal Crystals, *Physical Review Letters*, vol. 50, Nos. 12, Mar. 21, 1983, pp. 900–903.

Pansu et al., "Thin Colloidal Crystals: A Series of Structural Transitions," *J. Physique*, vol. 44, Apr. 1983, pp. 531–536.

Van Winkle et al., "Layering Transitions in Colloidal Crystals as Observed by Diffraction and Direct–Lattice Imaging," *Physical Review*, vol. 34, No. 1, Jul. 1986, pp. 562–573.

Mürau et al., "An Electrophoretic Radiographic Device," *SID 79 Digest*, 1979, pp. 46–47.

Blazo, S.F. "High Resolution Electrophoretic Display with Photoconductor Addressing" *SID 82 Digest*, 1982, pp. 92–93.

Bryce, "Seeing Through Synthetic Metals," *Nature*, vol. 335, No. 6185, Sep. 1, 1988, pp. 12–13.

Croucher et al., "Electrophoretic Display: Materials as Related to Performance," *Photographic Science and Engineering*, vol. 25, No. 2, 1981, pp. 80–86.

Ji et al., "P–50: Polymer Walls in Higher–Polymer–Content Bistable Reflective Cholesteric Displays," *SID 96 Digest*, 1996, pp. 611–613.

Lee, "Fabrication of Magnetic Particles Display," *Proceeding of the S.I.D.*, vol. 18. Nos. 3 & 4, 1977, pp. 283–288.

Pankove, "Color Reflection Type Display Panel," *RCA Technical Notes*, No. 535: Mar. 1962, pp. 1–2.

Saitoh, M. et al., "A Newly Developed Electrical Twisting Ball Display," *Proceedings of the SID*, vol. 23, No. 4, 1982, pp. 249–253.

Sheridon et al., "The Gyricon–A Twisting Ball Display," *Proceeding of the SID*, vol. 18, Nos. 3 and 4, 1977, pp. 289–293.

Shiffman et al., "An Electrophoretic Image Display with Internal NMOS Address Logic and Display Drivers," *Proceedings of the SID*, vol. 25, No. 2, 1984, pp. 105–115.

Vance, "Optical Characteristics of Electrophoretic Displays," *Proceeding of the SID*, vol. 18, Nos. 3 and 4, 1977, 267–274.

Yamaguchi et al., "Equivalent Circuit of Ion Projection-Driven Electrophoretic Display," *IEICE Transaction*, vol. 74, No. 12, 1991, pp. 4152–4156.

"Electronic Ink' Sign Debuts at JC Penney," *Boston Globe*, May 4, 1999.

Drzaic, P. et al., "A Printed and Rollable Bistable Electronic Display," SID International Symposium Digest of Technical Papers, vol. 29, May 17, 1998.

Toyama, J. et al., "An Electrophoretic Matrix Display with External Logic and Driver Directly Assembled to the Panel," SID International Symposium Digest of Technical Papers, vol. 25, Jun. 14, 1994.

Jackson, T. et al., "Organic Thin–Film Transistors for Organic Light–Emitting Flat–Panel Display Backplanes," IEEE Journal of Selected Topics in Quantum Electronics, vol. 4, No. 1, Jan. 1, 1998.

Sano, "Block Copolymer Epitaxy," *Advanced Materials*, 1997.

Wong et al., "Patterning of poly(3–alkylthiophene) thin films by direct–write ultraviolet laser lithography," *Materials Science and Engineering*, 1998.

Hebner, T.R. et al., "Ink–Jet Printing of Doped Polymers for Organic Light Emitting Devices," American Institute of Physics, Applied Physics Letters, vol. 72, No. 5, Feb. 2, 1998, pp. 519–521.

Bonse et al., "Integrated a–Si:H/Pentacene Inorganic/Organic Complementary Circuits," International Electron Devices Meeting, San Francisco, California, Dec. 6–9, 1998, *IEDM Technical Digest*, 1998, pp. 248–252.

* cited by examiner

US 6,842,657 B1

REACTIVE FORMATION OF DIELECTRIC LAYERS AND PROTECTION OF ORGANIC LAYERS IN ORGANIC SEMICONDUCTOR DEVICE FABRICATION

RELATED APPLICATIONS

This application is a continuation in part of U.S. Ser. No. 09/289,036 filed on Apr. 9, 1999 and issued on Feb. 11, 2003 as U.S. Pat. No. 6,518,949, and claims priority to provisional applications U.S. Ser. No. 60/144,943 filed on Jul. 21, 1999 and U.S. Ser. No. 60/147,989 filed on Aug. 10, 1999, the entire contents of which are incorporated herein by reference.

TECHNICAL FIELD

The invention relates generally to manufacturing of semiconductor devices and more particularly the protection during manufacture of organic layers in organic material-based electronic devices.

BACKGROUND OF THE INVENTION

The fabrication of all-printed backplanes on polymeric substrates through use of solvent-based inks offers the potential for lower cost, flexible, or large area displays. There are numerous potential applications for such displays, such as: rolled displays; affordable large area displays; displays incorporated into fabrics; and as a paper substitute. Unfortunately, the solvent in the ink materials will typically attack previously deposited organic layers or a polymer substrate. This attack can lead to damage of an organic layer or its interface with other layers, as through intermixing of layers.

In particular, the interface between an organic semiconductor and a gate dielectric is critical to the performance of a organic-based thin-film transistor ("OTFT"). Solvent used to pattern the semiconductor can damage an organic dielectric, while deposition of an organic dielectric can entail use of a solvent that damages an organic semiconductor. Further, standard cleaning solvents, for example acetone and isopropanol, can affect organic interfaces. Attempts to use materials that are solvent tolerant greatly reduces the choice of materials available for formation of OTFTs.

What are needed are relatively simple, low cost manufacturing methods that reduce solvent caused damage to organic layers to help realize the advantages of OTFTs on polymer substrates.

SUMMARY OF THE INVENTION

The present invention provides a method to protect organic layers in OTFTs from solvent caused damage. In one embodiment, use of damaging solvents is avoided in the formation of dielectric layers. In another embodiment, a barrier layer protects an adjacent organic layer from damaging solvents.

Rather than use of solvent-based compounds for deposition of dielectric layers on organic semiconductors, a first alternative provides for use of reactive layers for formation of a dielectric layer. A reactive layer can be deposited directly onto an organic semiconductor or can be deposited onto, for example, a gate electrode followed by deposition of the organic semiconductor onto the reactive layer. Chemical reaction of the reactive material with the semiconductor then leads to formation of the dielectric layer. A gate dielectric can be produced in this manner, without use of solvents that could damage the organic semiconductor.

The organic semiconductor can be subjected to various types of reactions, for example oxidizing, reducing, or isomerizing. Any conductive or semiconductive behavior of the organic semiconductor can be sufficiently minimized in a portion of material neighboring the location of the reactive material to cause formation of insulating material.

In an alternative embodiment, an electrochemical cell is used to form a dielectric layer at an organic semiconductor and gate electrode interface. Application of a voltage between the organic semiconductor and the gate electrode causes a reaction between the organic semiconductor and gate electrode material adjacent to the interface and formation of a dielectric layer at the interface.

In another alternative embodiment, radiation is employed to cause the formation of a dielectric layer on an organic semiconductor. Via electromagnetic irradiation, preferably ultraviolet radiation, or electron beam irradiation, for example, a portion of the surface region of the organic semiconductor can be converted to insulating material. With use of an electron beam, selected areas of the surface of the organic semiconductor can be irradiated to produced a patterned dielectric layer. With use of masks and ultraviolet radiation illumination, a similarly patterned dielectric layer can be formed.

In alternative embodiments, other organic layers can similarly be treated to form dielectric layers, for example to passivate or protect layers in the TFT. In a further alternative, an organic conductor gate electrode is reacted with a reactive layer to form a dielectric layer.

In one embodiment, a method of manufacturing a semiconductor device comprises the steps of: a) providing an organic semiconductor layer; b) depositing a reactive species on a portion of the organic semiconductor layer; and c) reacting the reactive species with the portion of the organic layer to form a dielectric layer.

In another embodiment, a method of manufacturing a semiconductor device comprises the steps of: a) providing an organic semiconductor layer; and b) exposing a surface of the organic semiconductor layer to a radiation to form a dielectric layer.

In another embodiment, a method of manufacturing a transistor comprises the steps of: a) providing an organic semiconductor layer adjacent a gate electrode; b) providing an electrochemical cell wherein the gate electrode is an electrode of the electrochemical cell; and c) applying a voltage to the gate electrode to cause an electrochemical reaction to form a gate dielectric between the gate electrode and the organic semiconductor layer.

In an alternative embodiment, an organic semiconductor layer can be protected from solvents employed in dielectric layer formation by use of a barrier layer. Barrier layers can provide more general protection. During the manufacture of an organic film-based TFT, various interfaces are vulnerable to solvents, for example, solvents in the inks that are employed in the use of printing processes.

Vulnerable interfaces are those that involve an organic layer, such as those found at a polymer substrate, an organic conductor gate electrode, an organic dielectric layer, an organic semiconductor, an organic conductor drain or source electrode, and an organic semiconductor. Solvent resistant barrier layers can be used to protect any such interfaces.

In one embodiment, a method of protecting organic layers in an electronic device, comprises the steps of: a) providing a first organic layer; b) providing a barrier layer adjacent to the first organic layer, wherein the barrier layer is resistant to a solvent; and c) providing a solution or a dispersion comprising the solvent and a layer-forming material adjacent to the first organic layer.

A barrier layer is generally chosen for its resistance to a particular solvent. A typical thickness for a barrier layer is 10–50 nm or about one tenth the thickness of the organic layer that the barrier is intended to protect from the solvent. Though organic or inorganic materials can be employed, barrier materials that are compatible with an all-printed manufacturing process are desirable for production of low cost, simple to manufacture TFTs. Such TFTs are of particular utility for use in arrays to address a display medium in an electrophoretic display device.

Depending on the nature of the layer to be protected, the barrier layer can be a conductor, an insulator, or a semiconductor.

BRIEF DESCRIPTION OF THE DRAWINGS

The invention, in accordance with preferred and exemplary embodiments, together with further advantages thereof, is more particularly described in the following detailed description, taken in conjunction with the accompanying drawings.

In the drawings, like reference characters generally refer to the same parts throughout the different views. Also, the drawings are not necessarily to scale, emphasis instead generally being placed upon illustrating principles of the invention.

DETAILED DESCRIPTION OF THE INVENTION

The invention relates to the manufacture of displays that utilize arrays of organic semiconductor based transistors. The invention is of particular use in the production of displays with an electrophoretic display medium and mitigates the problem of solvent attack of organic layers during manufacture. Formation of dielectric layers will first be described, followed by a description of protection of organic layers during manufacture.

I. Method of Forming Dielectric Layers in Organic Semiconductor Devices

Figure 1A:
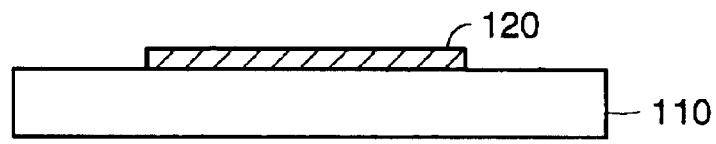
FIG. 1a shows a cross-sectional view of an embodiment of an electronic device at an intermediate stage of fabrication.

With reference to FIG. 1a, an embodiment is shown in which an organic semiconductor layer 110 is deposited, followed by deposition of a reactive species 120. The reactive species 120 can be deposited uniformly, or patterned onto desired areas of the organic semiconductor. The reactive species 120 is selected from a variety of materials that are reactive with the organic semiconductor. The selected material will depend on the type of desired reaction, for example, reduction, oxidation, or isomerization.

Figure 1B:
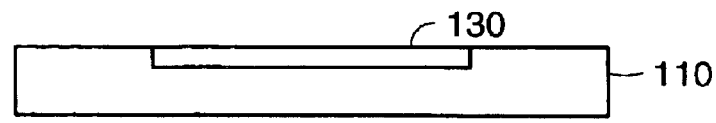
FIG. 1b shows a cross-sectional view of an electronic device that corresponds to the embodiment of FIG. 1a, at a later stage of fabrication.

With reference to FIG. 1b, after reaction of the reactive species 120 with the organic semiconductor 110, a dielectric layer 130 forms at the general location of the former reactive species 120.

Figure 2A:
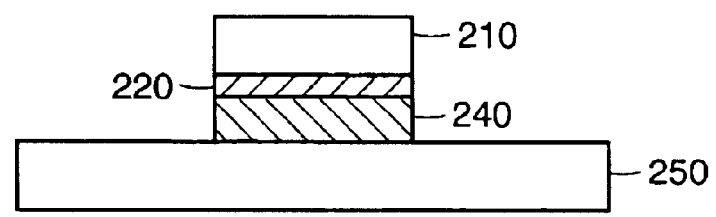
FIG. 2a shows a cross-sectional view of an embodiment of an electronic device at an intermediate stage of fabrication.
Figure 2B:
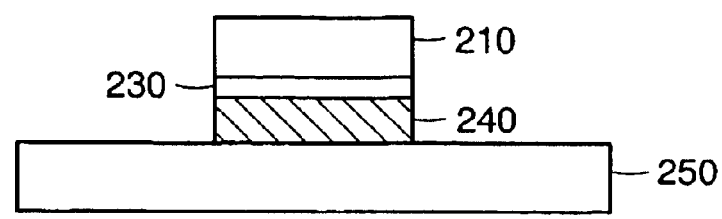
FIG. 2b shows a cross-sectional view of an electronic device that corresponds to the embodiment of FIG. 2a, at a later stage of fabrication.

With reference to FIGS. 2a and 2b, and in greater detail, an embodiment of formation of a bottom gate capacitor structure is shown. In this embodiment, a substrate 250 is provided. A gate electrode 240 is then formed on the substrate 250. A reactive species 220 is deposited on the gate electrode, followed by deposition of an organic semiconductor 210 on the reactive species 220. It should be understood that the reactive species 220 may be brought into contact with the organic semiconductor 210 by a variety of means, for example, deposition of a suspension or solution or lamination or previously manufactured components.

After reaction of the organic semiconductor 210 with the reactive species 220, a dielectric layer 230 is formed at the interface between the organic semiconductor 210 and the reactive species 220. In the embodiment of FIG. 2b, the dielectric layer 230 serves as a gate dielectric for a capacitor.

Figure 3:
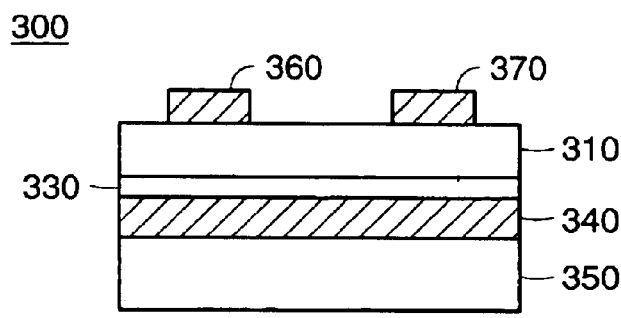
FIG. 3 shows a cross-sectional view of an embodiment of a transistor.

With reference to FIG. 3, an embodiment of a transistor 300 formed through use of the above described method is shown. The transistor 300 comprises: a substrate 350; a gate electrode 340 supported by the substrate 350; a gate oxide 330 in contact with the gate electrode 340 and formed by prior reaction of a reactive layer with a portion of an organic semiconductor 310; a source electrode 360 in electrical contact with the organic semiconductor 310; and a drain electrode 370 in contact with the organic semiconductor 310.

Figure 4A:
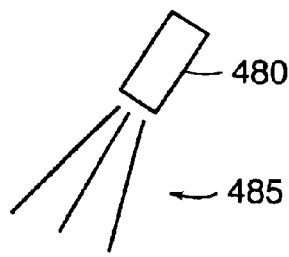
FIG. 4a shows a cross-sectional view of an embodiment of an electronic device at an intermediate stage of fabrication.
Figure 4A:
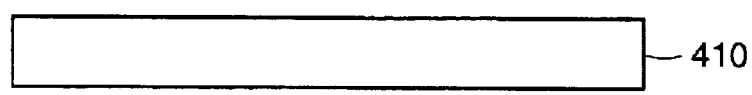
Figure 4B:
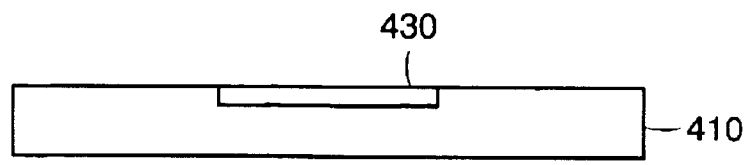
FIG. 4b shows a cross-sectional view of an electronic device that corresponds to the embodiment of FIG. 4a, at a later stage of fabrication.

With reference to FIGS. 4a and 4b, an alternative method for formation of dielectric layers on organic semiconductors is depicted. In the embodiment of FIG. 4a, an organic semiconductor 410 and a radiation source 480 are provided. During manufacture, portions of the organic semiconductor 410 are exposed to radiation 485 from the radiation source 480. The exposed portions of the organic semiconductor 410 are converted to a dielectric layer 430. Various forms of radiation 485 can be employed for formation of dielectric layers 430, for example electron beam or electromagnetic radiation. Ultraviolet electromagnetic radiation is a preferred form of radiation.

Figure 5A:
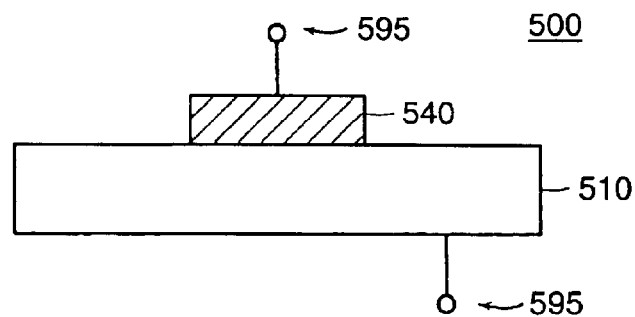
FIG. 5a shows a cross-sectional view of an embodiment of an electronic device at an intermediate stage of fabrication.
Figure 5B:
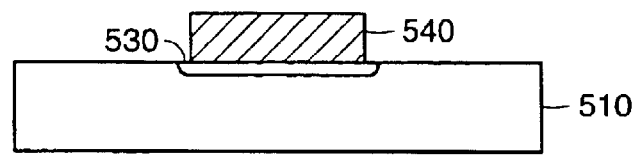
FIG. 5b shows a cross-sectional view of an electronic device that corresponds to the embodiment of FIG. 5a, at a later stage of fabrication.

With reference to FIGS. 5a and 5b, an embodiment of another alternative method for formation of dielectric layers on organic semiconductors is depicted. FIG. 5a shows an embodiment of an electrochemical cell 500 comprising: an organic semiconductor 510; a gate electrode 540 in contact with the organic semiconductor 540; and electrical leads 595 for applying voltages in the cell 500. In response to application of a voltage in the electrochemical cell 500, current flows between the gate electrode 540 and the organic semiconductor 540 and a portion of the organic semiconductor 510 is converted to a dielectric layer 530.

Figure 6A:
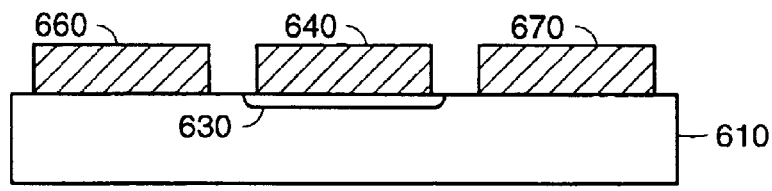
FIG. 6a shows a cross-sectional view of an embodiment of an electronic device at an intermediate stage of fabrication.
Figure 6B:
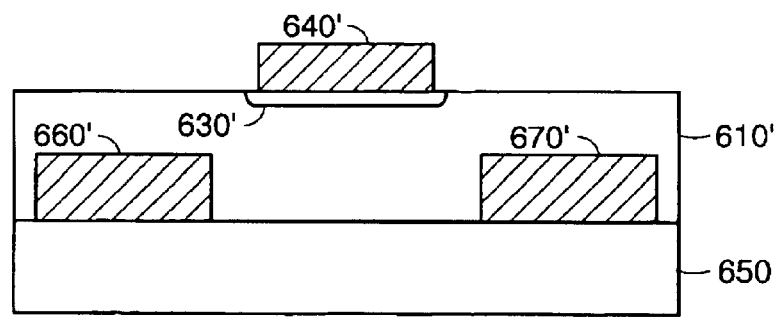
FIG. 6b shows a cross-sectional view of an electronic device that corresponds to the embodiment of FIG. 6a, at a later stage of fabrication.

With reference to FIGS. 6a and 6b, two alternative embodiments of top-gate transistors that can be manufactured through use of the above described methods are shown. In the embodiment shown in FIG. 6a, a source electrode 660, a gate electrode 640, and a drain electrode 670 are supported by an organic semiconductor 610. A gate oxide layer 630 has been formed by one of the above described methods for forming a dielectric layer. In the embodiment of FIG. 6b, the source electrode 660' and the drain electrode 670' are first placed in contact with a substrate 650. The organic semiconductor 610' is then deposited over the electrodes 660' and 670' and the substrate 650. Lastly, the gate electrode 640' is supported by the organic semiconductor 610' and has a gate oxide 630' at the interface with the organic semiconductor 610' where the gate oxide has again been formed by one of the above described methods.

Various alternatives lie within the general principles of the above described methods. For example, a portion of a gate electrode can be converted to a dielectric layer rather than conversion of a portion of an organic semiconductor. For example, a gate electrode can be formed from an organic conductor and a portion of the organic conductor can be converted to a dielectric layer.

Various alternatives for top or bottom gate transistors can advantageously employ the above described manufacturing methods. For example, a bottom gate transistor can be manufactured by depositing a reactive material over a gate electrode and substrate, followed by deposition or lamination with an organic semiconductor. Reaction of the reactive material with the organic semiconductor will then yield a dielectric layer that lies at the interface of both the substrate with the organic semiconductor and at the interface of the gate electrode with the semiconductor layer. Alternatively, the reactive material can be deposited solely on the gate electrode. A variety of methods for film deposition and patterning, as found in the prior art, can be employed in manufacturing of the transistors. Conductive polymers such as polyaniline, polypyrrole and PEDOT can be used as gate electrodes, and parts of films of these materials can be converted into dielectrics upon exposure to UV or E-beam radiation.

The above described methods are of particular use in the formation of electrophoretic displays. Further details concerning methods and materials involved in the manufacture of electrophoretic displays are given in later sections of this description.

II. Method Protecting Organic Layers in Semiconductor Devices

Figure 7:
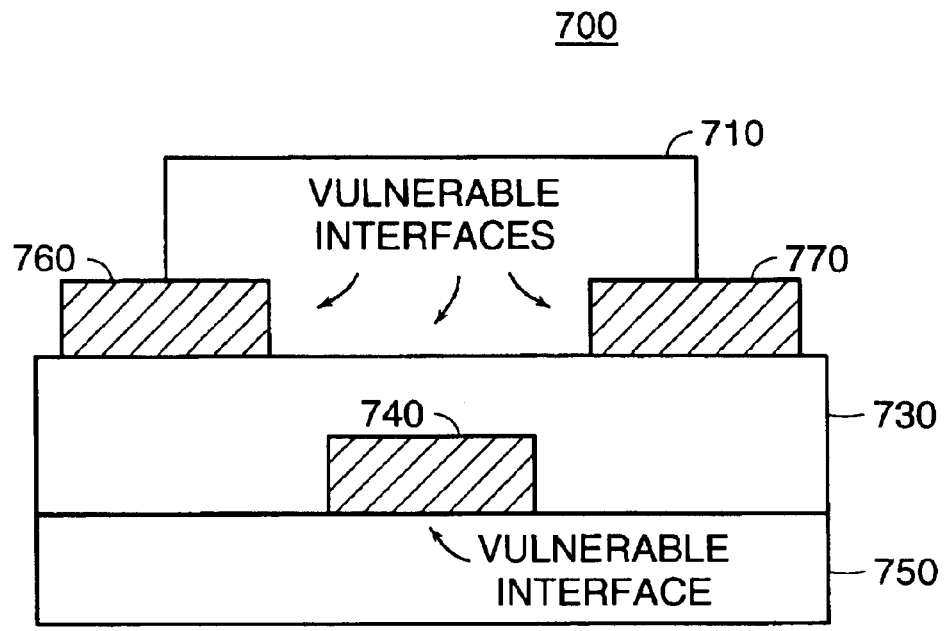
FIG. 7 shows a cross-sectional view of an embodiment of a transistor that shows interfaces that are vulnerable to solvents.

With reference to FIG. 7, various vulnerable interfaces in an embodiment of an organic-based thin film transistor ("OTFT") 700 are shown. The OTFT 700 comprises: a polymer substrate 750; a gate electrode 740 in contact with the substrate 750; a dielectric layer deposited over the gate electrode 740 and the substrate 750; drain 760 and source 770 electrodes supported by the dielectric layer 730; and an organic semiconductor 710 supported by the dielectric layer 730 and in electrical contact with the electrodes 760 and 770. During the manufacture of the OTFT 700, various interfaces are vulnerable to solvents, for example, solvents in the inks that are employed in the use of printing processes.

As indicated in FIG. 7, vulnerable interfaces are those that involve an organic layer, such as those found at the substrate 750 and gate electrode 740 interface, the dielectric layer 730 and organic semiconductor 710 interface, the drain electrode 760 and organic semiconductor 710 interface, and the source electrode 770 and organic semiconductor 710 interface.

In a preferred embodiment, the substrate 750 is a polymer and all materials 710, 730, 740, 760, and 770 are deposited via printing techniques. Among other advantages, this provides for a relatively low cost display device. Other solvent-cast deposition methods, for example spin coating, can similarly be employed to achieve lower display cost.

Figure 8:
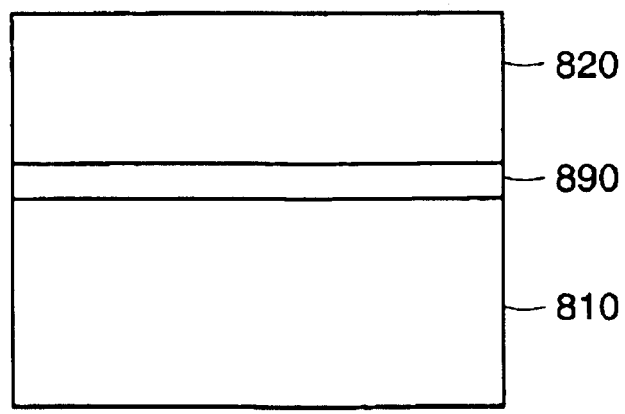
FIG. 8 is a cross-sectional view of a portion of an electronic device in the region of a barrier layer

With reference to FIG. 8, vulnerable interfaces can be protected by formation of a protective barrier layer thereon. After providing a first layer 810, for example an organic layer, a barrier layer 890 is formed on the first layer 810. An ink or other solvent containing material is then deposited on the barrier layer 890 to form a second layer 820. The barrier layer 890 is specifically chosen for its resistance to the solvent in use. A typical thickness for the barrier layer 890 is 10–50 nm. A suitable thickness is also about one tenth the thickness of the organic layer 810.

Depending on the nature of the layers 810 and 820, the barrier layer can be a conductor, an insulator, or a semiconductor. For example, with reference to FIG. 7, a conductor barrier layer would be used at the interface between the drain electrode 760 and the organic semiconductor 710 to maintain electrical contact at this interface. Generally, such a conductive barrier layer would be patterned so as not to be continuous between the source electrode 760 and the drain electrode 770 and so cause undesirable current leakage.

Alternatively, a function of a barrier layer 890 placed between an organic semiconductor and a dielectric layer can be promotion of preferred growth of domains in the organic semiconductor. Such domains can comprise, for example, large crystalline domains, or domains in which the orientation of the organic conjugated backbone has a preferred orientation or direction.

Figure 9:
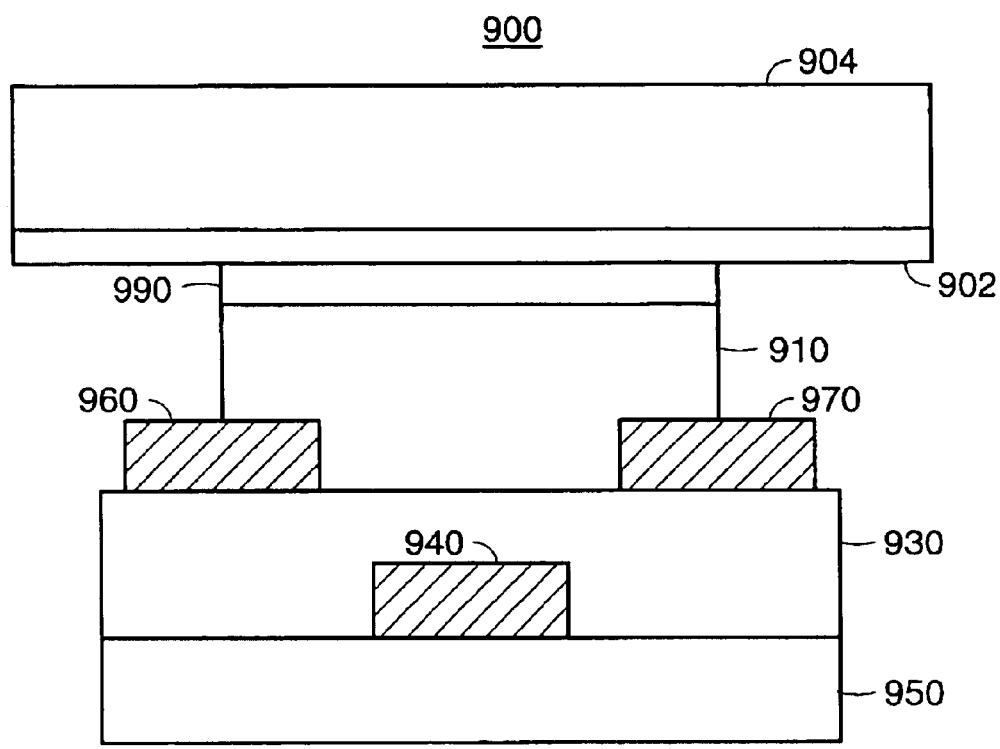
FIG. 9 is a cross-sectional view of an embodiment of an electrophoretic display device.

With reference to FIG. 9, an example embodiment of an electrophoretic display device 900 is shown. The device 900 comprises: a substrate 950, for example a silicon wafer; a gate electrode 940, for example, heavily doped silicon; a dielectric layer 930, for example, silicon dioxide; source 960 and drain 970 electrodes, for example gold; an organic semiconductor 910, for example poly(alkylthiophene), pentacene, alpha-sexithiophene, or copper phthalocyanine ("CuPc"); a barrier layer 990; an electrophoretic display medium assembly 904; and a lamination adhesive 902, for example a water-based polyurethane emulsion, where the lamination adhesive is used to attach the display medium assembly 904 to the organic semiconductor 910 and other portions of the OTFT.

In the embodiment of FIG. 9, an array of OTFTs are first separately manufactured from the manufacture of the electrophoretic display medium assembly 904. The display medium assembly 904 is comprised, for example, of an encapsulated electrophoretic display medium printed onto a indium tin oxide ("ITO") coated glass plate. The OTFT array is then bonded, in this embodiment, to the display medium assembly 904 with the lamination adhesive 902.

A preferred material for formation of the barrier layer 990 in the embodiment of FIG. 9 is Du Pont 5036 Heat Seal/Encapsulant (Du Pont Photopolymer & Electronics Materials, Barley Mill Plaza P10-2329, Wilmington, Del. 19880-0010). Without use of the barrier layer 990, solvent in the lamination adhesive 902 enters the organic semiconductor 910 and destroys the electrical behavior of the OTFT.

Figure 10A:
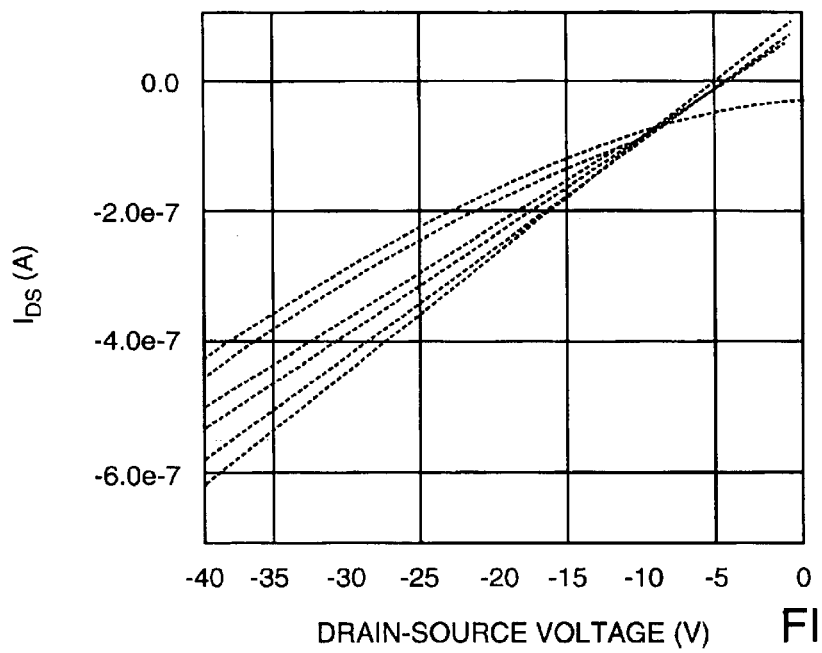
FIG. 10a is a current-voltage plot for a sample transistor formed without a barrier layer that otherwise corresponds to the embodiment of FIG. 9.
Figure 10B:
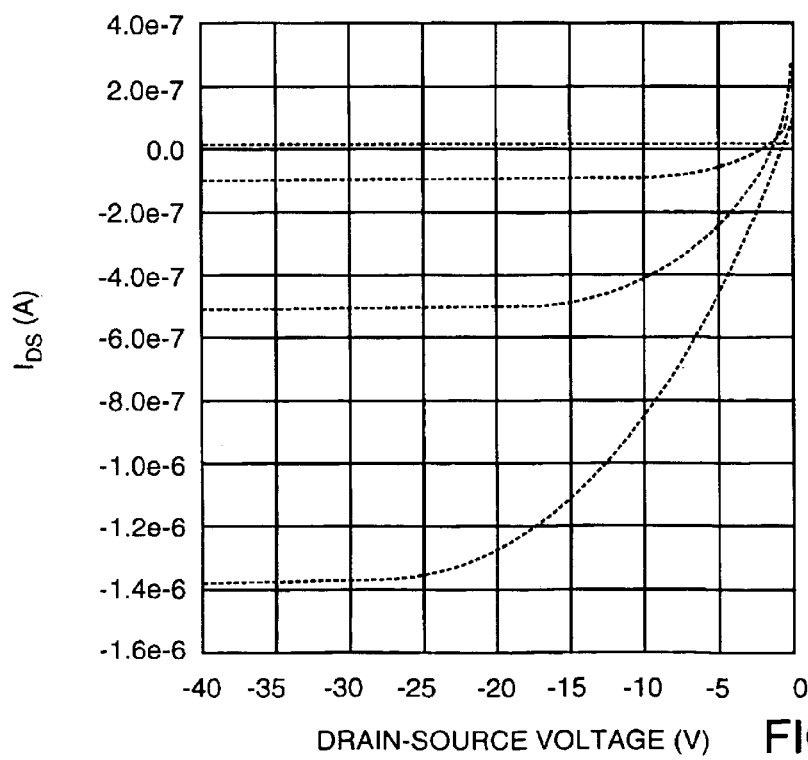
FIG. 10b is a current-voltage plot for a sample transistor that corresponds to the embodiment of FIG. 9, including a barrier layer.

With reference to FIGS. 10a and 10b, the electrical behavior of a OTFT incorporated in a working sample corresponding to the embodiment of FIG. 9 is shown. FIGS. 6a and 6b each show six I-V curves for a OTFT with a CuPc organic semiconductor 910. The OTFT of FIG. 6a was formed without a barrier layer 990 while the OTFT of FIG. 6b was formed with a Du Pont 5036 barrier layer 990.

The six I-V curves in FIG. 6a correspond to gate voltages of 10, 0, −10, −20, −30, and −40 volts. The proper functioning of the OTFT has been destroyed by solvent from the lamination adhesive 902. The six I-V curves in FIG. 6b, three of which overlap in the figure, also correspond to gate voltages of 10, 0, −10, −20, −30, and −40 volts. The OTFT performs properly where it was formed with a barrier layer 990 that prevented solvent from attacking the organic semiconductor 910.

The barrier layer can comprise inorganic or organic materials. These alternatives are discussed in detail in the following.

Inorganic Barrier Materials—Inorganic materials such as silica, alumina, and silicon nitride have excellent resistance to almost all organic solvents. Such barrier layers 890 can be deposited by various means, for example, spin-coating, chemical vapor deposition, ion-milling, and sputtering. Spin-coating, in particular, is low-cost and suitable for large area deposition.

Spin-on glass, for example, can also be cured at room temperature. Spin-on glass, however, has the disadvantages of low density and pin holes. To protect an organic layer where high quality of the organic layer is desired, for example, an organic gate dielectric layer, a higher quality barrier layer must be employed.

Organic Barrier Materials—A preferred embodiment makes use of a compatible spin-on polymeric barrier layer 890. This permits realization of an all-printed display manufacturing process. For example, if the first layer 810 is polystyrene and a solvent carrier used in deposition of the second layer 820 is toluene, the solvent would readily damage the polystyrene without use of the barrier layer 890. For this example, a water soluble polyvinyl alcohol could be used to form a suitable barrier layer 890. This provides a high quality barrier layer 890 that is not dissolved by toluene.

Other examples of polar-solvent soluble materials include silicones and fluorinated species. These can deposited, for example, via casting with a solvent carrier or deposited as a reactive material followed by a cure under heat or radiation to complete formation of the barrier layer 890. Generally, any solvent involved in the deposition of the barrier layer 890 should not be a solvent for the material in the first layer 810.

Organic layers, for an example a first layer 810 that is an organic layer, can be deposited by, for example, spin coating, screen-printing or injection printing. Further, a thin organic barrier layer 890 can be deposited from a gas phase, for example, by deposition of a gas phase monomer through a mask onto the first layer 810. The deposited material can then be polymerized to complete formation of the thin organic barrier layer 890. For example, perylene can be employed for a barrier layer 890. Other possible barrier layer 890 materials include poly(meth)acrylates or polyurethanes.

All of the above methods can be advantageously employed in the formation of arrays of polymer-based thin-film transistors in the manufacture of electrophoretic displays. Such displays can take advantage of low cost deposition steps, such as printing of inks, and can be very flexible, in part though use of flexible, polymer substrates. Further descriptive detail concerning materials and methods utilized in the manufacture of electrophoretic displays is given in the following.

III. Method of Manufacturing an Electrophoretic Display Assembly

In a preferred embodiment, an encapsulated electrophoretic display assembly is manufactured with use of printing or coating steps on a wide variety of flexible substrates. As used herein, the term "printing" includes all forms of printing and coating, including, but not limited to, pre-metered coatings such as patch die coating, slot or extrusion coating, slide or cascade coating, and curtain coating: roll coating such as knife over roll coating, forward and reverse roll coating, gravure coating, dip coating, spray coating, meniscus coating, spin coating, brush coating, air knife coating, silk screen printing processes, electrostatic printing processes, thermal printing processes, and other similar techniques. Thus, the resulting display can be flexible. Further, because the display medium can be printed (using a variety of methods), the display itself can be made inexpensively.

Further, printing methods can be used to form the electrical connections and other conductive portions of a display. A rear conductor ("rear" referring to a side of a display that is opposite to that viewed by a user) can be ether opaque or transparent. This allows the use of a variety of printed rear conductors, including graphite inks, silver inks, or conductive polymers The front conductor ("front" referring to a side of a display that is viewed by a user) must be transparent, but need not have excellent conductivity. Even materials with relatively poor conductivity, though amenable to printing, can be employed, for example conductive colloidal suspensions and conductive polymers such as are commonly used in anti-static applications.

A microencapsulated electrophoretic medium, unlike a liquid crystal medium, is amendable to use with a wide number of intrinsically conductive polymer systems, including derivatives of polyaniline, polypyrrole, polythiophene, and polyphenylenevinylene.

In short, the present invention permits a more advantageous use of cost savings allowed by use of printing methods for formation of conducting materials in a display assembly.

The following describes in detail various embodiments of materials with applications to the electrophoretic display medium.

IV. Materials for Use in Electrophoretic Displays

Useful materials for constructing the above-described encapsulated electrophoretic displays are discussed in detail below. Many of these materials will be known to those skilled in the art of constructing conventional electrophoretic displays, or those skilled in the art of microencapsulation.

A. Particles

There is much flexibility in the choice of particles for use in electrophoretic displays, as described above. For purposes of this invention, a particle is any component that is charged or capable of acquiring a charge (i.e., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Finally, the particles may be surface treated so as to improve charging or interaction with a charging agent, or to improve dispersibility.

A preferred particle for use in electrophoretic displays of the invention is Titania. The titania particles may be coated with a metal oxide, such as aluminum oxide or silicon oxide, for example. The titania particles may have one, two, or more layers of metal-oxide coating. For example, a titania particle for use in electrophoretic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as, for example, rutile (titania), anatase (titania), barium sulfate, kaolin, or zinc oxide are useful. Some typical particles have high refractive indices, high scattering coefficients, and low absorption coefficients. Other particles are absorptive, such as carbon black or colored pigments used in paints and inks. The pigment should also be insoluble in the suspending fluid. Yellow pigments such as diarylide yellow, hansa yellow, and benzidin yellow have also found use in similar displays. Any other reflective material can be employed for a light colored particle, including non-pigment materials, such as metallic particles.

Useful neat pigments include, but are not limited to, $PbCrO_4$, Cyan blue GT 55-3295 (American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Blac, CBS (E. I. du Pont de Nemours and Company, Inc., Wilmington, Del.), Crocein Scarlet N Ex (du Pont) (27290), Fiber Black VF (DuPont) (30235), Luxol Fast Black L (DuPont) (Solv. Black 17), Nirosine Base No. 424 (DuPont) (50415 B), Oil Black BG (DuPont) (Solv. Black 16), Rotalin Black RM (DuPont), Sevron Brilliant Red 3 B (DuPont); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black IA (GAF) (Basic Blk. 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3 G (GAF) (Azoic Blk. 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 $\mu$m), Statex B-12 (Columbian Carbon Co.) (a furnace black of 33 $\mu$m average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminum salt onto a substrate. Typical examples are peacock blue lake (CI Pigment Blue 24) and Persian orange (lake of CI Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N-(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 $\mu$m, as long as the particles are smaller than the bounding capsule. In a preferred embodiment, the density of the electrophoretic particle may be substantially matched to that of the suspending (ie., electrophoretic) fluid. As defined herein, a suspending fluid has a density that is "substantially matched" to the density of the particle if the difference in their respective densities is between about zero and about two g/ml. This difference is preferably between about zero and about 0.5 g/ml.

Useful polymers for the particles include, but are not limited to: polystyrene, polyethylene, polypropylene, phenolic resins, Du Pont Elvax resins (ethylene-vinyl acetate copolymers), polyesters, polyacrylates, polymethacrylates, ethylene acrylic acid or methacrylic acid copolymers (Nucrel Resins—DuPont, Primacor Resins— Dow Chemical), acrylic copolymers and terpolymers (Elvacite Resins, DuPont) and PMMA. Useful materials for homopolymer/pigment phase separation in high shear melt include, but are not limited to, polyethylene, polypropylene, polymethylmethacrylate, polyisobutylmethacrylate, polystyrene, polybutadiene, polyisoprene, polyisobutylene, polylauryl methacrylate, polystearyl methacrylate, polyisobornyl methacrylate, poly-t-butyl methacrylate, polyethyl methacrylate, polymethyl acrylate, polyethyl acrylate, polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. From the following non-limiting examples, it may be seen that the processes and materials for both the fabrication of particles and the charging thereof are generally derived from the art of liquid toner, or liquid immersion development. Thus any of the known processes from liquid development are particularly, but not exclusively, relevant.

New and useful electrophoretic particles may still be discovered, but a number of particles already known to those skilled in the art of electrophoretic displays and liquid toners can also prove useful. In general, the polymer requirements for liquid toners and encapsulated electrophoretic inks are similar, in that the pigment or dye must be easily incorporated therein, either by a physical, chemical, or physicochemical process, may aid in the colloidal stability, and may contain charging sites or may be able to incorporate materials which contain charging sites. One general requirement from the liquid toner industry that is not shared by encapsulated electrophoretic inks is that the toner must be capable of "fixing" the image, i.e., heat fusing together to create a uniform film after the deposition of the toner particles.

Typical manufacturing techniques for particles are drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 $\mu$m. It is then dispersed in a carrier liquid, for example ISOPAR® (Exxon, Houston, Tex.), optionally with some charge control agent(s), and milled under high shear for several hours down to a final particle size and/or size distribution.

Another manufacturing technique for particles drawn from the liquid toner field is to add the polymer, pigment, and suspending fluid to a media mill. The mill is started and simultaneously heated to temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few microns in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric latices, for example with metal oxides or dyes.

B. Suspending Fluid

The suspending fluid containing the particles can be chosen based on properties such as density, refractive index, and solubility. A preferred suspending fluid has a low dielectric constant (about 2), high volume resistivity (about $10^{15}$ ohm-cm), low viscosity (less than 5 cst), low toxicity and environmental impact, low water solubility (less than 10 ppm), high specific gravity (greater than 1.5), a high boiling point (greater than 90° C.), and a low refractive index (less than 1.2).

The choice of suspending fluid may be based on concerns of chemical inertness, density matching to the electrophoretic particle, or chemical compatibility with both the electrophoretic particle and bounding capsule. The viscosity of the fluid should be low when you want the particles to move. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles because it increases the range of polymeric materials useful in fabricating particles of polymers and pigments. Organic solvents, such as halogenated organic solvents, saturated linear or branched hydrocarbon silicone oils, and low molecular weight halogen-containing polymers are some useful suspending fluids. The suspending fluid may comprise a single fluid. The fluid will however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as, for example, decane epoxide and dodecane epoxide; vinyl ethers, such as, for example, cyclohexyl vinyl ether and Decave® (International Flavors & Fragrances, Inc., New York, N.Y.); and aromatic hydrocarbons, such as, for example, toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar® series (Exxon, Houston, Tex.), Norpar® (series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden® (a perfluorinated ether from Ausimont, Morristown, N.J.), or Krytox® from DuPont (Wilmington, Del.). In a preferred embodiment, the suspending fluid is a poly (chlorotrifluoroethylene) polymer. In a particularly preferred embodiment, this polymer has a degree of polymerization from about 2 to about 10. Many of the above materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. A preferred surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable, forming a solid absorbing polymer inside the bounding shell.

There are many dyes that can be chosen for use in encapsulated electrophoretic display. Properties important here include light fastness, solubility in the suspending liquid, color, and cost. These are generally from the class of azo, anthraquinone, and triphenylmethane type dyes and may be chemically modified so as to increase the solubility in the oil phase and reduce the adsorption by the particle surface.

A number of dyes already known to those skilled in the art of electrophoretic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michier's hydrol, Malachite Green, Crystal Violet, and Auramine O.

C. Charge Control Agents and Particle Stabilizers

Charge control agents are used to provide good electrophoretic mobility to the electrophoretic particles. Stabilizers are used to prevent agglomeration of the electrophoretic particles, as well as prevent the electrophoretic particles from irreversibly depositing onto the capsule wall. Either component can be constructed from materials across a wide range of molecular weights (low molecular weight, oligomeric, or polymeric), and may be pure or a mixture. In particular, suitable charge control agents are generally adapted from the liquid toner art. The charge control agent used to modify and/or stabilize the particle surface charge is applied as generally known in the arts of liquid toners, electrophoretic displays, non-aqueous pain; dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electrophoretic particles. The charging properties of the pigment itself may be accounted for by taking into account the acidic or basic surface properties of the pigment, or the charging sites may take place on the carrier resin surface (if present), or a combination of the two. Additional pigment properties which may be relevant are the particle size distribution, the chemical composition, and the lightfastness. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

Charge adjuvants may also be added. These materials increase the effectiveness of the charge control agents or charge directors. The charge adjuvant may be a polyhydroxy compound or an aminoalcohol compound, which are preferably soluble in the suspending fluid in an amount of at least 2% by weight. Examples of polyhydroxy compounds which contain at least two hydroxyl groups include, but are not limited to, ethylene glycol, 2,4,7,9-tetramethyl-decyne-4,7-diol, poly(propylene glycol), pentaethylene glycol, tripropylene glycol, triethylene glycol, glycerol, pentaerythritol, glycerol tris(12-hydroxystearate), propylene glycol monohydroxystearate, and ethylene glycol monohydroxystearate. Examples of aminoalcohol compounds which contain at least one alcohol function and one amine function in the same molecule include, but are not limited to, triisopropanolamine, triethanolamine, ethanolamine, 3-amino-1-propanol, o-aminophenol, 5-amino-1-pentanol, and tetrakis(2-hydroxyethyl)ethylene-diamine. The charge adjuvant is preferably present in the suspending fluid in an amount of about 1 to about 100 mg/g of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor® TOT, TBT, and TE Series, DuPont, Wilmington, Del.); hydrophobing agents, such as long chain (C12 to C50) alkyl and alkyl benzene sulphonic acids, fatty amines or diamines and their salts or quarternary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art.

Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, sodium bis(2-ethyl hexyl) sulfosuccinate, calcium dodecyl benzene sulfonate, calcium petroleum sulfonate, neutral or basic barium dinonylnaphthalene sulfonate, neutral or basic calcium dinonylnaphthalene sulfonate, dodecylbenzenesulfonic acid sodium salt, and ammonium lauryl sulphate. Useful metal soaps include, but are not limited to, basic or neutral barium petronate, calcium petronate, Co-, Ca-, Cu-, Mn-, Ni-, Zn-, and Fe-salts of naphthenic acid, Ba-, Al-, Zn-, Cu-, Pb-, and Fe-salts of stearic acid, divalent and trivalent metal carboxylates, such as aluminum tristearate, aluminum octanoate, lithium heptanoate, iron stearate, iron distearate, barium stearate, chromium stearate, magnesium octanoate, calcium stearate, iron naphthenate, and zinc naphthenate, Mn- and Zn-heptanoate, and Ba-, Al-, Co-, Mn-, and Zn-octanoate. Useful block or comb copolymers include, but are not limited to, AB diblock copolymers of (A) polymers of 2-(N,N)-dimethylaminoethyl methacrylate quaternized with methyl-p-toluenesulfonate and (B) poly-2-ethylhexyl methacrylate, and comb graft copolymers with oil soluble tails of poly (12-hydroxystearic acid) and having a molecular weight of about 1800, pendant on an oil-soluble anchor group of poly (methyl methacrylate-methacrylic acid). Useful organic amides include, but are not limited to, polyisobutylene succinimides such as OLOA 371 and 1200, and N-vinyl pyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electrophoretic displays, nonaqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapsulation

There is a long and rich history to encapsulation, with numerous processes and polymers having proven useful in creating capsules. Encapsulation of the internal phase may be accomplished in a number of different ways. Numerous suitable procedures for microencapsulation are detailed in both *Microencapsulation, Processes and Applications*, (I. E. Vandegaer, ed.), Plenum Press, New York, N.Y. (1974) and Gutcho, *Microcapsules and Mircroencapsulation Techniques*, Nuyes Data Corp., Park Ridge, N.J. (1976). The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes include, but are not limited to, gelatin, polyvinyl alcohol, polyvinyl acetate, and cellulosic derivatives, such as, for example, carboxymethylcellulose. Useful materials for complex coacervation processes include, but are not limited to, gelatin, acacia, carageenan, carboxymethylcellulose, hydrolyzed styrene anhydride copolymers, agar, alginate, casein, albumin, methyl vinyl ether co-maleic anhydride, and cellulose phthalate. Useful materials for phase separation processes include, but are not limited to, polystyrene, PMMA, polyethyl methacrylate, polybutyl methacrylate, ethyl cellulose, polyvinyl pyridine, and poly acrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, MMA and acrylonitrile. Finally, useful materials for interfacial polymerization processes include, but are not limited to, diacyl chlorides, such as, for example, sebacoyl, adipoyl, and di- or poly-amines or alcohols, and isocyanates. Useful emulsion polymerization materials may include, but are not limited to, styrene, vinyl acetate, acrylic acid, butyl acrylate, tbutyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation procedure involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electrophoretic composition (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one especially useful in situ polymerization processes, urea and formaldehyde condense in the presence of poly (acrylic acid) (See, e.g., U.S. Pat. No. 4,001,140). In other useful process, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and poly isocyanates. The entire disclosures of the U.S. Pat. Nos. 4,001,140 and 4,273,672 are hereby incorporated by reference herein.

The coacervation approach also utilizes an oil/water emulsion. One or more colloids are coacervated (ie., agglomerated) out of the aqueous phase and deposited as shells around the oily droplets through control of temperature, pH and/or relative concentrations, thereby creating the microcapsule. Materials suitable for coacervation include gelatins and gum arabic.

The interfacial polymerization approach relies on the presence of an oil-soluble monomer in the electrophoretic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in terms of choosing the dielectric liquid.

Coating aids can be used to improve the uniformity and quality of the coated or printed electrophoretic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface leveling while minimizing other defects within the coating. Surface tension modifiers include, but are not limited to fluorinated surfactants, such as, for example, the Zonyl® series from DuPont (Wilmington, Del.), the Fluorod® series from 3M (St. Paul, Minn.), and the fluoroakyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkyl benzenes, natural fats, fatty acids, and metallic soaps, and silicone antifoaming agents made from the combination of dimethyl siloxane polymers and silica. Stabilizers such as uv-absorbers and antioxidants may also be added to improve the lifetime of the ink.

Other additives to control properties like coating viscosity and foaming can also be used in the coating fluid. Stabilizers (UV-absorbers, antioxidants) and other additives which could prove useful in practical materials.

E. Binder Material

The binder is used as a non-conducting, adhesive medium supporting and protecting the capsules, as well as binding the electrode materials to the capsule dispersion. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methylpyrrolidone, N-vinylpyrrolidone, the various Carbowax® species (Union Carbide, Danbury, Conn.), and poly-2-hydroxyethylacrylate.

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60×G, the capsules are found at the bottom of the centrifuge tube, while the water portion is at the top. The water portion is carefully removed (by decanting or pipetting). The mass of the remaining capsules is measured, and a mass of resin is added such that the mass of resin is between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the water-borne system, with the obvious exception of the water itself. The latitude in formulation for solvent systems is enormous, limited only by solvent choices and polymer solubility. Of considerable concern in solvent-based systems is the viability of the capsule itself the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method of manufacturing a semiconductor device comprising the steps of:
   a) providing an organic semiconductor layer;
   b) depositing a reactive species on a portion of the organic semiconductor layer; and
   c) reacting the reactive species with the portion of the organic layer to form a dielectric layer.

2. The method of claim 1 wherein reacting comprises one of oxidizing, reducing or isomerizing.

3. The method of claim 1 wherein the dielectric layer is a gate dielectric layer.

4. The method of claim 3 wherein step a) further comprises the steps of a1) providing a gate electrode and a2) providing the reactive species on the gate electrode.

5. The method of claim 1 wherein the reactive species comprises one of a liquid, a solid, or a suspension.

6. The method of claim 1 wherein the dielectric layer comprises an insulating layer of a thin film transistor.

7. The method of claim 1 wherein the semiconductor device is part of a circuit for addressing an electronic display.

* * * * *